(12) United States Patent
Kraehmer et al.

(10) Patent No.: US 7,679,831 B2
(45) Date of Patent: Mar. 16, 2010

(54) PROJECTION OBJECTIVE OF A MICROLITHOGRAPHIC PROJECTION EXPOSURE APPARATUS

(75) Inventors: Daniel Kraehmer, Aalen (DE); Johannes Ruoff, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 254 days.

(21) Appl. No.: 11/838,995

(22) Filed: Aug. 15, 2007

(65) Prior Publication Data

US 2008/0043331 A1 Feb. 21, 2008

Related U.S. Application Data

(60) Provisional application No. 60/822,427, filed on Aug. 15, 2006.

(30) Foreign Application Priority Data

Aug. 15, 2006 (DE) .................. 10 2006 038 398

(51) Int. Cl.
G02B 9/00 (2006.01)
(52) U.S. Cl. ........................ 359/649; 359/494
(58) Field of Classification Search ......... 359/494–499, 359/355, 352, 357, 483, 485, 649–651, 754, 359/720; 355/53, 67, 71
See application file for complete search history.

(56) References Cited

U.S. PATENT DOCUMENTS

| | | | |
|---|---|---|---|
| 2,699,706 A * | 1/1955 | Boone | ........................ 359/498 |
| 7,075,720 B2 | 7/2006 | McGuire, Jr. | |
| 2002/0027719 A1* | 3/2002 | Kreuzer | ...................... 359/631 |
| 2003/0011896 A1 | 1/2003 | Shiraishi | |
| 2003/0086157 A1* | 5/2003 | McGuire, Jr. | ............... 359/352 |
| 2003/0137733 A1* | 7/2003 | Gerhard et al. | .............. 359/494 |
| 2004/0105170 A1 | 6/2004 | Krahmer et al. | |
| 2004/0145806 A1 | 7/2004 | Hoffman et al. | |
| 2006/0050400 A1 | 3/2006 | Hoffman et al. | |
| 2006/0109560 A1 | 5/2006 | Kamenov et al. | |
| 2006/0238895 A1 | 10/2006 | Clauss | |
| 2007/0035848 A1 | 2/2007 | Schuster | |

FOREIGN PATENT DOCUMENTS

| | | |
|---|---|---|
| WO | WO 02/093209 A2 | 11/2002 |
| WO | WO 02/099500 A2 | 12/2002 |
| WO | WO 2006/089919 A1 | 8/2006 |

* cited by examiner

*Primary Examiner*—Joseph Martinez
*Assistant Examiner*—James R Greece
(74) *Attorney, Agent, or Firm*—Fish & Richardson P.C.

(57) ABSTRACT

Projection objectives of micro-lithographic projection exposure apparatuses, as well as related methods and components, are disclosed.

20 Claims, 13 Drawing Sheets

PROJECTION OBJECTIVE OF A MICROLITHOGRAPHIC PROJECTION EXPOSURE APPARATUS

CROSS-REFERENCE TO RELATED APPLICATION

This application claims priority under 35 U.S.C. §119(e)(1) to U.S. Patent Application Ser. No. 60/822,427, filed Aug. 15, 2006, and under 35 U.S.C. §119 to German Patent Application Serial Number 10 2006 038 398.2, filed Aug. 15, 2006, both of which are hereby incorporated by reference.

FIELD

The disclosure relates to projection objectives of microlithographic projection exposure apparatuses, as well as related methods and components.

BACKGROUND

Microlithographic projection exposure apparatus are used to manufacture microstructured components such as for example integrated circuits or LCD's. A projection exposure apparatus of this kind includes an illumination device and a projection objective. In the microlithography process the image of a mask (also referred to as reticle) that is illuminated by the illumination device is projected via the projection objective onto a substrate (for example a silicon wafer) that is coated with a light-sensitive coating (photoresist) and arranged in the image plane of the projection objective, in order to transfer the mask structure onto the light-sensitive coating.

SUMMARY

In some embodiments, the present disclosure can provide a projection objective of a microlithographic projection exposure apparatus, which allows the use of highly refractive crystal materials while limiting the detrimental influence of intrinsic birefringence.

In a first aspect, the disclosure generally provides a projection objective with an optical axis. The projection objective is configured to project an image of a mask which can be positioned in an object plane onto a light-sensitive coating which can be positioned in an image plane. The projection objective includes at least one lens which has at least one curved lens surface and includes at least four lens elements that include intrinsically birefringent material which are arranged so that they follow each other in mutu-ally adjacent relationship along the optical axis of the projection objective. The four lens elements include two pairs of lens elements. The two pairs of lens elements have crystallographic cuts that are different from each other. The lens elements of each pair have the same crystallographic cut and are arranged relative to each other with a rotary offset about the optical axis of the projection objective. The projection objective is a microlithographic projection exposure apparatus projection objective.

The term "optical axis" as used herein means a straight line or a sequence of straight line sections which runs through the curvature centers of the rotationally symmetric optical components of the projection objective.

In some embodiments, putting a lens together from at least four lens elements with the lens elements clocked relative to each other can assist in compensation of the intrinsic birefringence which can be particularly effective for a lens in last place to the image side with a relatively large thickness and high refractive index. Due to the fact that the lens according to the disclosure is formed of several shells, comparable to an onion, a compensation of intrinsic birefringence can be achieved with the aforementioned arrangement of these shells already in the lens by itself (in essence even without the need for a further compensation to occur at another place in the projection objective).

In certain embodiments, two of the four lens elements have a crystallographic [111]-cut and the other two of the four lens elements have a crystallographic [100]-cut. In accordance with the common terminology, crystallographic [111]-cut, for example, means that in the respective lens element the crystallographic [111]-axis coincides with the lens axis (or the optical axis of the projection objective, respectively). Furthermore, the respective crystallographic axis and a lens axis or optical axis, respectively, can be regarded as to coincide if the angle between the lens axes is less than 5°.

In some embodiments, the four lens elements follow each other in alternating sequence relative to their respective crystallographic cuts. In regard to this arrangement of the shells, use is made of the further observation that with the sequence in which the lens elements alternate relative to their crystallographic cuts, a residual error in the IB-compensation can typically be reduced by a factor of the order of about 2 in comparison to an arrangement where the lens elements with the same crystallographic cut are grouped so that they follow each other directly. This effect, which manifests itself through a surprisingly clear quantitative result, can be attributed in physical terms to the fact that the Jones matrices which serve to describe the polarization caused by intrinsic birefringence are not mathematically commutative, meaning that their sequence in a multiplication cannot be changed without thereby changing the result (i.e. A*B≠B*A).

In some embodiments, the lens according to the disclosure has a convex-curved lens surface to the side of the object plane. A lens surface of this shape can accept rays with high aperture angles and is therefore particularly advantageous in high-aperture systems. This lens can be a planar-convex lens arranged in an immersion objective in last position to the side of the image plane, whose planar light exit surface borders on the immersion medium.

In certain embodiments, this lens is arranged in last position to the image-plane side of the projection objective. Especially in the last lens on the image-plane side, it is of particular importance to use materials with relatively high refractive indices and thus, considering the materials that suggest themselves in this case, to be able to compensate a relatively strong intrinsic birefringence, and therefore the design configuration according the disclosure is particularly advantageous for this lens.

In some embodiments, the lens elements are made of a material selected from the group that contains garnets, in particular lutetium aluminum garnet ($Lu_3Al_5O_{12}$) and yttrium aluminum garnet ($Y_3Al_5O_{12}$), lithium barium fluoride ($LiBaF_3$), and spinel, in particular magnesium spinel ($MgAl_2O_4$). In these materials which exhibit a relatively pronounced birefringence, the configuration according to the disclosure proves to be particularly advantageous, so that materials with a comparatively high refractive index can be used in which the intrinsic birefringence is effectively compensated.

In certain embodiments, the lens elements are arranged in mutually adjacent relationship along the optical axis, i.e. without further optical element being arranged between the lens elements.

In some embodiments, at least two of the at least four lens elements are joined together in an optically seamless manner.

In this way, the elements which are assembled like shells in the onion-like configuration of the lens work again like a single lens in regard to the scalar phase, i.e. the wave front, so that undesirable interface-related deflections of the light rays at the transition between the lens elements are avoided.

In certain embodiments, at least two of the at least four lens elements are separated from each other by a gap, so that the manufacturing cost is reduced in comparison to joining the lens elements together seamlessly with the technique of wringing. In this case, to reduce undesirable interface-related deflections of the light rays, the gap can be filled with a liquid that has a refractive index which differs by no more than 30% (e.g., no more than 20%, no more than 10%) from the refractive indices of the materials of the adjoining lens elements. Depending on the refractive indices of the adjoining lens elements, suitable liquids are for example so-called high-index liquids of the kind used as immersion liquids adjacent to the wafer plane, such as for example cyclohexane (n≈1.57 for a wavelength of 193 nm) or decaline (n≈1.65 for a wavelength of 193 nm).

In some embodiments, two of the four lens elements are of a crystallographic [111]-cut, while the other two of the same four lens elements are of a [100]-cut. In this case the lens element in first position of the four elements relative to the direction of light propagation can have a [111]-cut or also a [100]-cut.

Each of the four lens elements can have at least one spherical lens surfaces (in particular two spherical lens surfaces), making the lenses relatively simple to produce and to match to each other. It is also possible that at least one of the four lens elements has an aspherical (but optionally still rotationally symmetric) lens surface. While this involves a larger manufacturing cost, it offers the possibility to optimize the polarization-related optical properties even further, i.e. to further reduce the IB-related residual retardation, due to the additional degrees of freedom gained from the aspherical design.

In another aspect, the disclosure general features a projection objective with an optical axis. The projection objective configured to project an image of a mask which can be positioned in an object plane onto a light-sensitive coating which can be positioned in an image plane. The projection objective includes at least one lens including at least four lens elements including intrinsically birefringent material which are arranged so that they follow each other in mutually adjacent relationship along the optical axis of the projection objective. For at least one of the four lens elements the optical axis of the projection objective is parallel to a crystallographic orientation of the lens element that is different from the crystallographic [100]-orientation, the crystallographic [110]-orientation, and the crystallographic [111]-orientation as well as from the respective crystal-lographic orientations that are equivalent to the crystallographic [100]-, [110]-, or [111]-orientation. The projection objective is a microlithographic projection exposure apparatus pro-jection objective.

Thus, according to this aspect, the disclosure can provide a projection objective with a lens composed of at least four lens elements, wherein at least one of these lens elements has a "free" crystal orientation, meaning that it is not cut according to one of the principal crystallographic cuts [100], [110] and [111]. As a consequence of this "free" crystallographic orientation, additional degrees of freedom are introduced, whereby (somewhat analogous to replacing a spherical lens surface with an aspherical lens surface) the optimizing possibilities are improved. Furthermore, with the inventive changeover to a "free" crystallographic orientation, it became possible to reduce the phase of the (1,1) Jones pupil, which improves the possibilities for meeting special further requirements that may be imposed on the optical image.

In a further aspect, the disclosure generally features a projection objective with an optical axis. The projection objective configured to project an image of a mask which can be positioned in an object plane onto a light-sensitive coating which can be positioned in an image plane. The projection objective includes at least one lens including at least four lens elements of lutetium aluminum garnet (Lu3Al5O12) which are arranged so that they follow each other along the optical axis. Two of the four lens elements have a crystallographic [111]-cut and are arranged relative to each other with a rotary offset about the optical axis of the projection objective. The other two of the four lens elements have a crystallographic [100]-cut and are arranged relative to each other with a rotary offset about the optical axis, and the projection objective is a microlithographic projection exposure apparatus projection objective.

In an additional aspect, the disclosure generally features a projection objective of a microlithographic projection exposure apparatus, having at least one lens that includes at least two lens elements being made of lutetium aluminum garnet (Lu3Al5O12). The lens elements have the same crystallographic cut and are arranged relative to each other with a rotary offset about the optical axis of the projection objective.

In a further aspect, the disclosure generally features a projection objective of a microlithographic projection exposure apparatus having at least one lens which includes at least four lens elements being made of lutetium aluminum garnet (Lu3Al5O12).

In another aspect, the disclosure generally features a projection objective of a microlithographic projection exposure apparatus, having at least one lens that includes at least two lens elements including lithium barium fluoride (LiBaF3). These lens elements have the same crystallographic cut and are arranged relative to each other with a rotary offset about the optical axis of the projection objective.

In an additional aspect, the disclosure generally features a lens. The lens includes at least four lens elements of lutetium aluminum garnet (Lu3Al5O12) which are arranged so that they follow each other along the optical axis. Two of the four lens elements have a crys-tallographic [111]-cut and are arranged relative to each other with a rotary offset about the optical axis. The other two of the four lens elements have a crystallographic [100]-cut and are arranged rela-tive to each other with a rotary offset about the optical axis. The lens is configured for use in a projection objective of a microlithographic projection exposure apparatus.

In a further aspect, the disclosure generally features a lens for a projection objective of a microlitho-graphic projection exposure apparatus, where the lens includes at least four lens elements made of lutetium aluminum garnet (Lu3Al5O12).

In another aspect, the disclosure generally features a lens. The lens is rotationally symmetric relative to a lens axis and includes of at least four lens elements of intrinsically birefringent material which are arranged so that they follow each other in mutually adjacent relationship along the optical axis of the projection objective. For at least one of the four lens elements the lens axis is parallel to a crystal orientation of the respective lens element that is different from the crystallographic [100]-orientation, the crystallographic [110]-orientation, and the crystal-lographic [111]-orientation as well as from the re-spective crystallographic orientations that are equivalent to the crystallographic [100]-, [110]-, or [111]-orientation. The lens is configured for a projection objective of a microlithographic pro-jection exposure apparatus.

In an additional aspect, the disclosure generally features a microlithographic projection exposure apparatus with an illumination device and a projection objective, wherein the projection objective is configured in accordance with a projection objective as described herein.

In another aspect, the disclosure generally features a method that includes providing a substrate which is at least partially covered with a coating of a light-sensitive material, and providing a mask including structures from which an image is to be formed. The method also includes providing a projection exposure apparatus as described herein, and projecting at least a part of the mask onto an area of the coating using the projection exposure apparatus to provide a microstructured component.

In an additional aspect, the disclosure generally features a microstructured component, which, for example, is manufactured using a projection exposure apparatus as described herein.

In some embodiments, at least two surfaces are faced towards each other and belonging to adjacent ones of the lens elements have radii of curvature such that the difference of the absolute values of these radii of curvature is less than 10% (e.g., less than 3%, less than 1%) of the larger one of the radii of curvature.

In certain embodiments, at least two surfaces are faced towards each other and belonging to adjacent ones of the lens elements have, at each point of one of the surfaces, a distance in the normal direction to the surface being less than 2 millimeters (mm) (e.g., less than 1 mm, less than 0.5 mm).

Further embodiments of the disclosure may be found in the following description as well as in the claims.

BRIEF DESCRIPTION OF THE DRAWINGS

The disclosure will be explained hereinafter in more detail with references to the examples of embodiments that are illustrated in the attached drawings, wherein.

DETAILED DESCRIPTION

Figure 1:
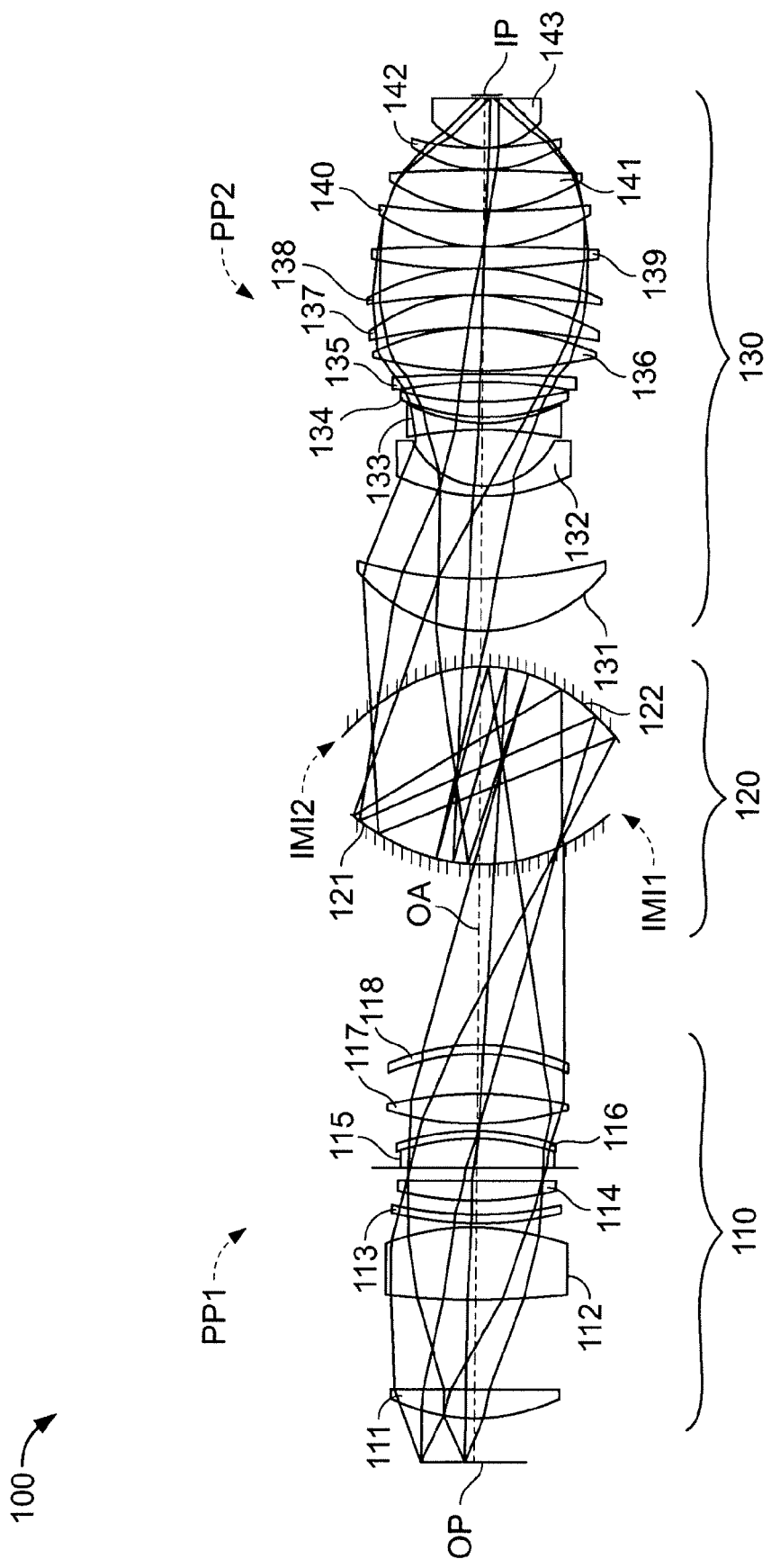
FIG. 1 shows an overall meridional section of a complete catadioptric projection objective according to an embodiment.

FIG. 1 shows a projection objective 100. The design data for this projection objective 100 are listed in Table 1. Shown in column 1 are the sequential numbers for the refracting or otherwise optically significant surfaces, in column 2 the respective radii (in mm) for these surfaces, in column 3 the distance (in mm) from the respective surface to the next-following surface which is called thickness, in column 4 the material following the respective surface, in column 5 the refractive index of this material for $\lambda=193$ nm, and in column 6 the optically usable free half-diameter of the optical component. Radii, thicknesses and half-diameters are stated in millimeters.

The surfaces that are marked with short horizontal lines and specified in Table 2 are aspherically curved, with the curvature of these surfaces being described by the following formula for aspheres:

$$P(h) = \frac{(1/r) \cdot h^2}{1 + \sqrt{1 - (1+cc)(1/r)^2 h^2}} + C_1 h^4 + C_2 h^6 + \ldots \quad (1)$$

wherein P stands for the sagittal height of the respective surface parallel to the optical axis, h represents the radial distance from the optical axis, r the radius of curvature of the respective surface, cc the conicity constant, and $C_1, C_2, \ldots$ the aspherical constants listed in Table 2.

The projection objective 100 which is of a catadioptric design has a first partial optical system 110, a second partial optical system 120, and a third partial optical system 130. The term "partial optical system" as used herein always means an arrangement of optical elements through which either a real image or an intermediate image of a real object is formed. In other words, each partial optical system always includes, beginning with a specific object plane or intermediate image plane, all of the optical elements up to the next-following real image or intermediate image.

The first partial optical system 110 includes an arrangement of refractive lenses 111 to 118 (being made of $SiO_2$, named as SILUV in Table 1) and projects the object plane "OP" into a first intermediate image IMI1, whose approximate location is indicated in FIG. 1 by an arrow. This first intermediate image IMI1 is projected by the second partial optical system 120 into a second intermediate image IMI2, whose approximate location is likewise indicated by an arrow in FIG. 1. The second partial optical system 120 includes a first concave mirror 121 and a second concave mirror 122, each of which is cut off in the direction perpendicular to the optical axis in such a way as to allow the light to continue on its path from the respective reflecting surface to the image plane IP. The second intermediate image IMI2 is projected by the third partial optical system 130 into the image plane IP.

The third partial optical system 130 includes an arrangement of refractive lenses 131 to 143, wherein the lens 143 in last position to the side of the image plane is a planar-convex lens with its convex-curved lens surface facing towards the object plane. This lens 143, in accordance with the present disclosure, is composed of a total of four lens elements as will now be explained by referring to FIG. 2. Between the light exit surface of the lens 143 and the light-sensitive coating which is arranged in the image plane IP when the projection objective 100 is in operation, there is an immersion liquid which in this example has a refractive index of $n_{Imm} \approx 1.65$ (named as HIINDEX in Table 1). An example of an immersion liquid that is suitable for this purpose goes by the common name of decaline. Another suitable immersion liquid is cyclohexane with $n_{Imm} \approx 1.57$ for an operating wavelength of 193 nm.

Figure 2:
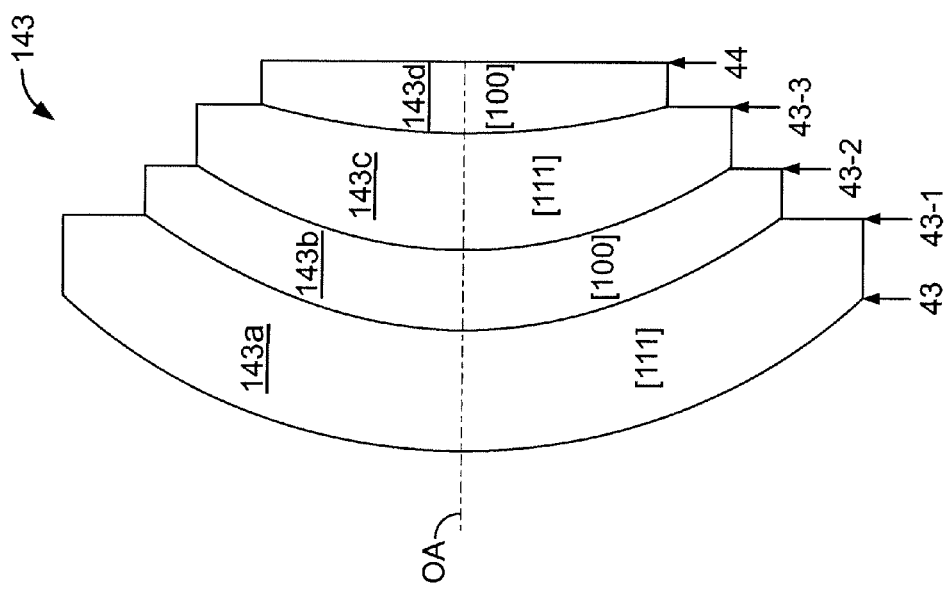
FIG. 2 shows a detailed lens section of the last lens to the image side of the projection objective of FIG. 1.

FIG. 2 shows a detailed lens section of the lens 143 in last position to the image side of the projection objective 100 of FIG. 1. The lens 143 is composed of a total of four lens elements 143a, 143b, 143c and 143d, which are arranged so that they follow each other along the optical axis OA. All of the lens elements 143a to 143d are made of lutetium aluminum garnet ($Lu_3Al_5O_{12}$, LuAG) whose maximum intrinsic birefringence at a wavelength of 193 nm is 30.1 nm/cm. The lens surfaces or the operative optical surfaces of the individual lens elements 143a to 143d in the illustrated example were selected to be spherical for manufacturing reasons, but as an alternative they could also be aspherical in order to achieve an even more far-reaching optimization of the polarization-related optical properties, i.e. a further reduction of the residual retardation.

As should further be noted, the lens elements 143a to 143d of the lens 143 follow each other in direct contact, being for example joined to each other in an optically seamless transition achieved through the technique of wringing. Alternatively, these lens elements could also be separated by a gap, where the latter can be filled with a liquid that has a refractive index which differs by no more than 30% (e.g., no more than 20%, no more than 10%) from the refractive indices of the materials of the adjoining lens elements.

The individual lens parameters for the lens elements 143a-143d are listed in Table 3. Shown in column 1 are the sequential numbers for the lens element surfaces, in column 2 the respective radii (in mm) for these surfaces, in column 3 the distance (in mm) from each surface to the next-following surface which is also referred to as thickness, in column 4 the optically usable free half-diameter of the lens element that follows the respective surface, and in column 5 the orientation (or crystallographic cut) of the lens element. Radii, thicknesses and half-diameters are again stated in millimeters.

According to the example of FIG. 2 and Table 3, the lens elements 143a-143d are made up of two pairs of lens elements, wherein the elements in each pair are of the same crystallographic cut and are set up relative to each other with a rotation about the optical axis OA.

More specifically, the lens elements 143a and 143c in first and third position along the optical axis OA in the direction of light propagation are of a crystallographic [111]-cut, meaning that in these lens elements the crystallographic [111]-axis is parallel to the optical axis OA of the projection objective 100. The lens elements 143b and 143d in second and fourth position along the optical axis OA in the direction of light propagation are of a crystallographic [100]-cut, meaning that in these lens elements the crystallographic [100]-axis is parallel to the optical axis OA of the projection objective 100. Accordingly, the four lens elements 143a-143d are arranged in alternating sequence with regard to their crystallographic cut orientations.

Furthermore, the lens elements 143a and 143c whose crystallographic cuts have a [111]-orientation are rotated relative to each other (i.e. "clocked") by an angle of 60° about the optical axis OA, while the lens elements 143b and 143d whose crystallographic cuts have a [100]-orientation are rotated relative to each other by an angle of 45° about the optical axis OA. According to the 3-fold symmetry of birefringence in [111]-lenses, a clocking angle of 60° between two [111]-lenses can be replaced by a clocking angle of 60°+m*120°, with m being an integer. Furthermore, according to the 4-fold symmetry of birefringence in [100]-lenses, a clocking angle of 45° between two [100]-lenses can be replaced by a clocking angle of 45°+n*90°, with n being an integer.

Although the aforementioned angles of rotation ("clocking angles") of 60° (or 60°+m*120°) for the lens elements with a crystallographic [111]-cut and of 45° (or 45°+n*90°) for the lens elements with a crystallographic [100]-cut represent the optimal values for the chosen arrangement in regard to minimizing the IB-related residual retardation, the disclosure is of course not limited to these angles, since a partial compensation can already be achieved even with angles of rotation that deviate from these values.

Figure 3:
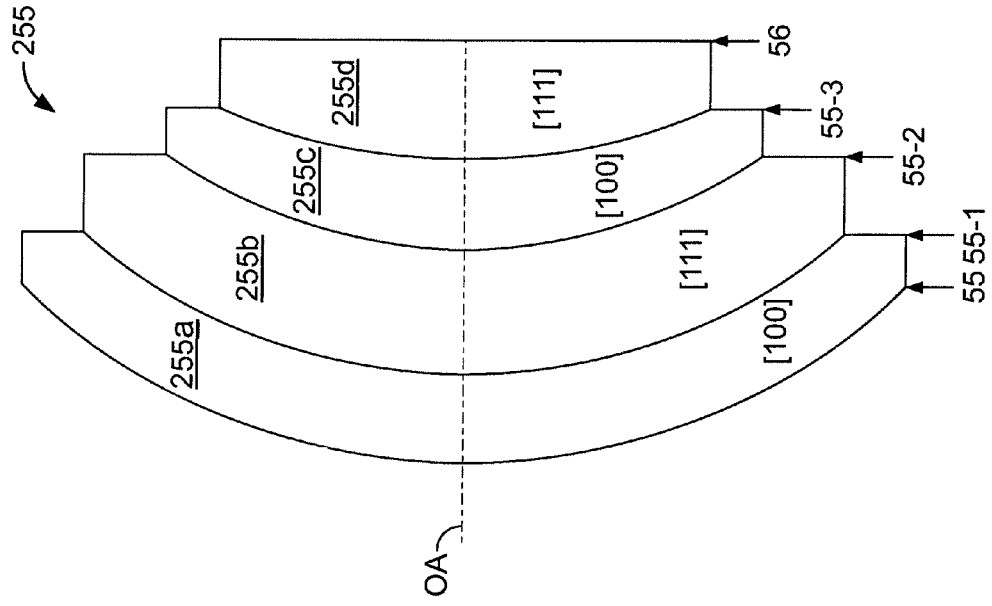
FIG. 3 shows a detailed lens section of a last lens to the image side according to an embodiment.

A further example for an embodiment of a lens 255 which can be used in accordance with the disclosure in the projection objective 100 of FIG. 1 in last position to the side of the image plane is composed of lens elements 255a-255d as illustrated in FIG. 3, with the lens parameters of the lens elements 255a-255d being listed in Table 4. The lens elements 255a-255d are likewise made of lutetium aluminum garnet ($Lu_3Al_5O_{12}$, LuAG).

According to the example of FIG. 3 and Table 4, the lens elements 255a-255d are likewise made up of two pairs of lens elements, wherein the elements in each pair are of the same crystallographic cut and are set up relative to each other with a rotation about the optical axis OA. More specifically, the lens elements 255a and 255c in first and third position along the optical axis OA in the direction of light propagation are of a crystallographic [100]-cut, meaning that in these lens elements the crystallographic [100]-axis is parallel to the optical axis OA of the projection objective. The lens elements 255b and 255d in second and fourth position along the optical axis OA in the direction of light propagation are of a crystallographic [111]-cut, meaning that in these lens elements the crystallographic [111]-axis is parallel to the optical axis OA of the projection objective 100. Accordingly, the four lens elements are arranged in alternating sequence with regard to their crystallographic cut orientations. Furthermore, and in this regard analogous to the embodiment of FIG. 2, the lens elements 255a and 255c whose crystallographic cuts have a [100]-orientation are rotated relative to each other (i.e.

"clocked") by an angle of 45° about the optical axis OA, while the lens elements 255b and 255d whose crystallographic cuts have a [111]-orientation are rotated relative to each other by an angle of 60° about the optical axis OA.

The disclosure is not limited to the crystallographic cut orientation [100] and [111] shown in FIGS. 2 and 3. Rather, it is possible to use variations of these embodiments wherein the at least four lens elements from which the lens of the inventive configuration is put together can also have pairs of lens elements sharing the same crystallographic cut but the cut is different from [100] and/or [111], wherein the lens elements within each pair are arranged with a rotation relative to each other about the optical axis. Furthermore, insofar analogous to FIGS. 2 and 3, the lens elements may be arranged in alternating sequence with regard to their crystallographic cut orientations.

Figure 6A:
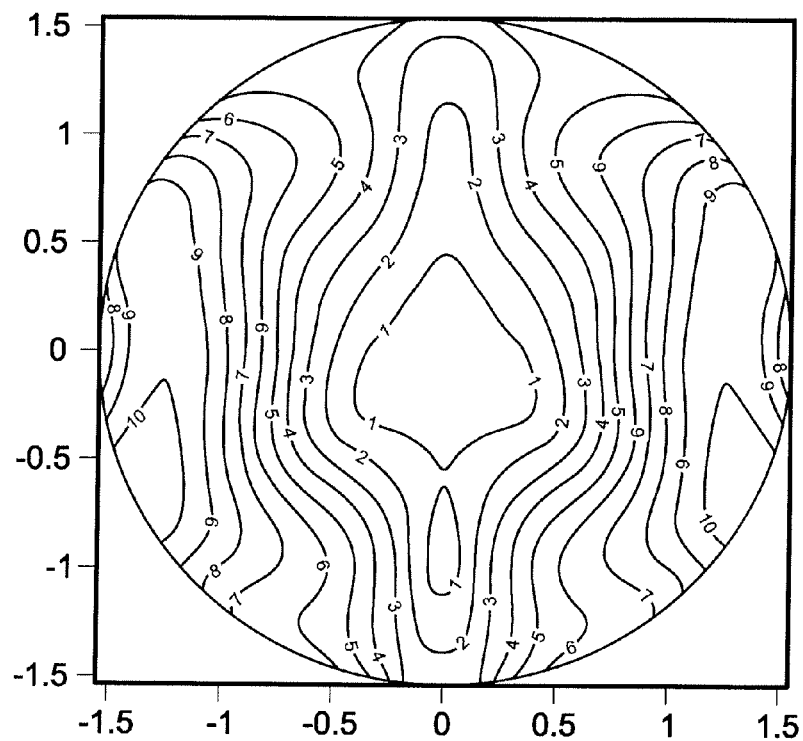
FIGS. 6a,b show the resultant retardation (in nm) in the projection objective of FIG. 1 for a ray bundle originating from the center of the object field (FIG. 6a) and for a ray bundle originating from the border of the object field (FIG. 6b), taking into account that the last lens on the image side conforms to the design according to the disclosure as shown in FIG. 2.
Figure 6B:
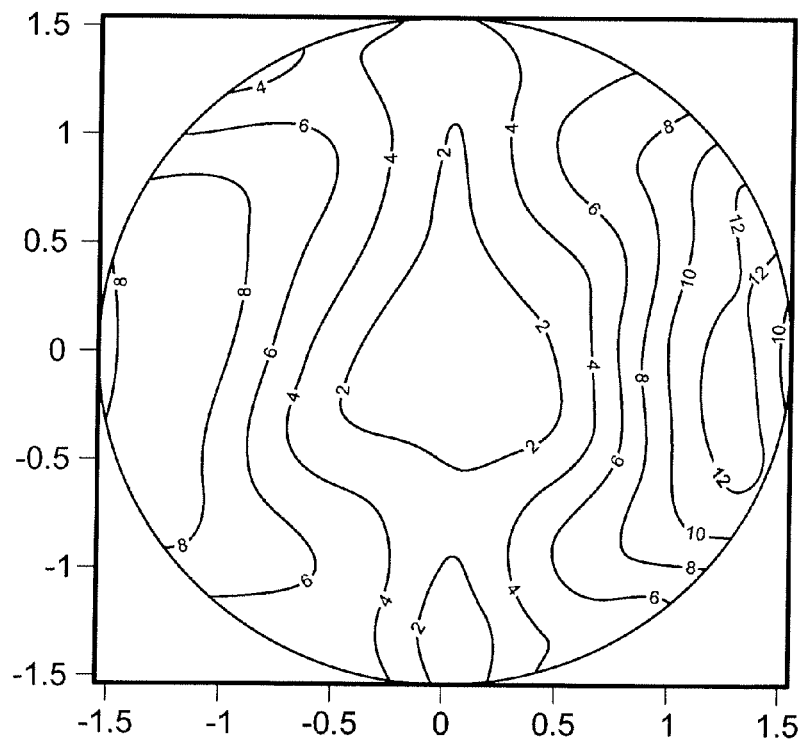

FIGS. 6a and 6b show the resultant retardation in the projection objective of FIG. 1 for a ray bundle originating from the center of the object field (FIG. 6a) and for a ray bundle originating from the border of the object field (FIG. 6b), taking into account that the last lens on the image side conforms to the design according to the disclosure as shown in FIG. 2. For comparison, FIG. 4 shows the retardation of a lens of conventional design with [111]-orientation of its crystallographic cut, i.e. without the inventive arrangement of at least four lens elements that are rotated relative to each other.

Figure 7A:
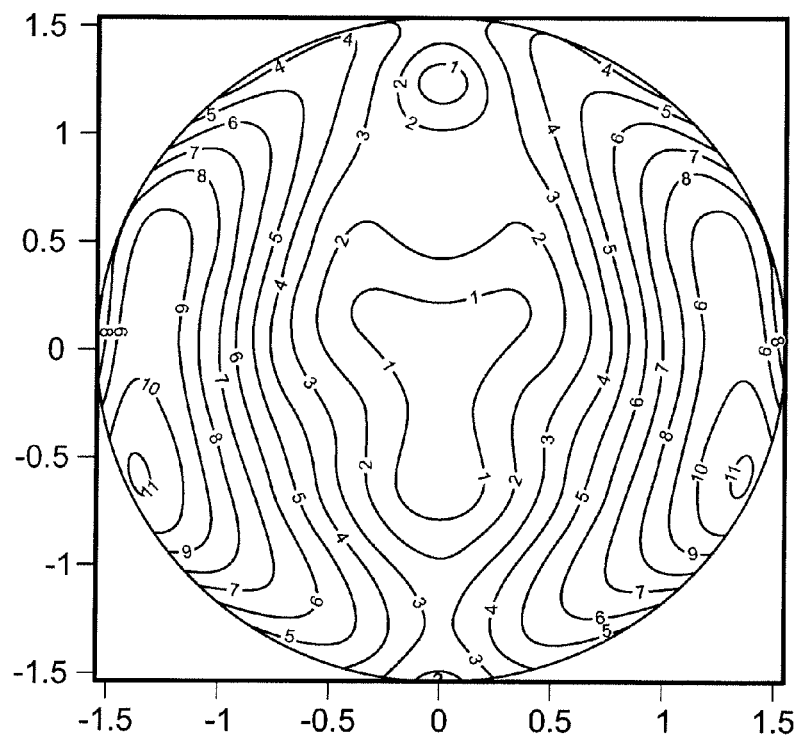
FIGS. 7a,b show the resultant retardation (in nm) in the projection objective of FIG. 1 for a ray bundle originating from the center of the object field (FIG. 7a) and for a ray bundle originating from the border of the object field (FIG. 7b), taking into account that the last lens on the image side conforms to the design according to the disclosure as shown in FIG. 3.
Figure 7B:
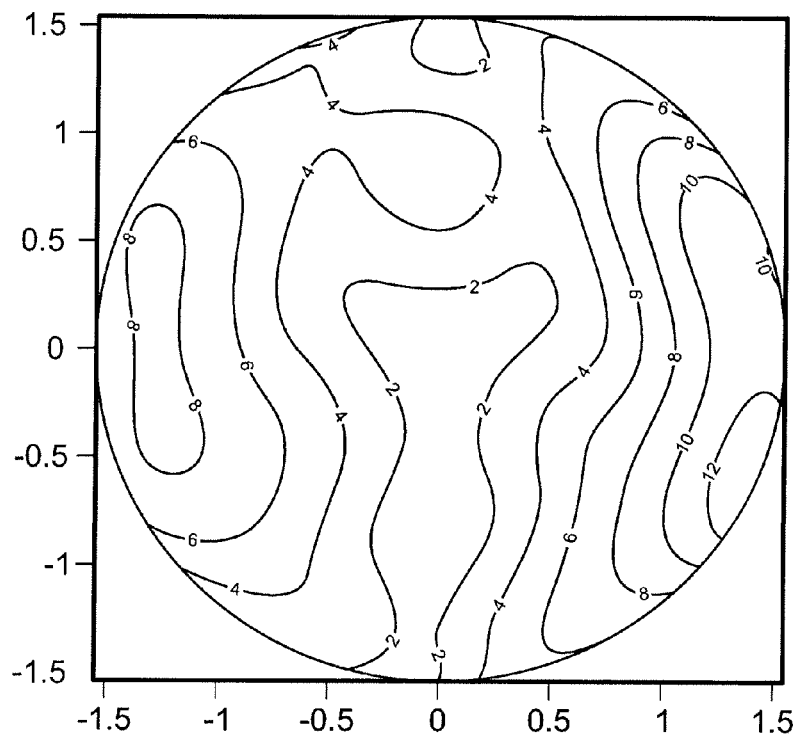

FIGS. 7a and 7b show the resultant retardation in the projection objective of FIG. 1 for a ray bundle originating from the center of the object field (FIG. 7a) and for a ray bundle originating from the border of the object field (FIG. 7b), taking into account that the last lens on the image side conforms to the design according to the disclosure as shown in FIG. 3. For comparison, FIG. 5 shows the retardation of a lens of conventional design with [100]-orientation of its crystallographic cut, i.e. without the inventive arrangement of at least four lens elements that are rotated relative to each other.

Figure 4:
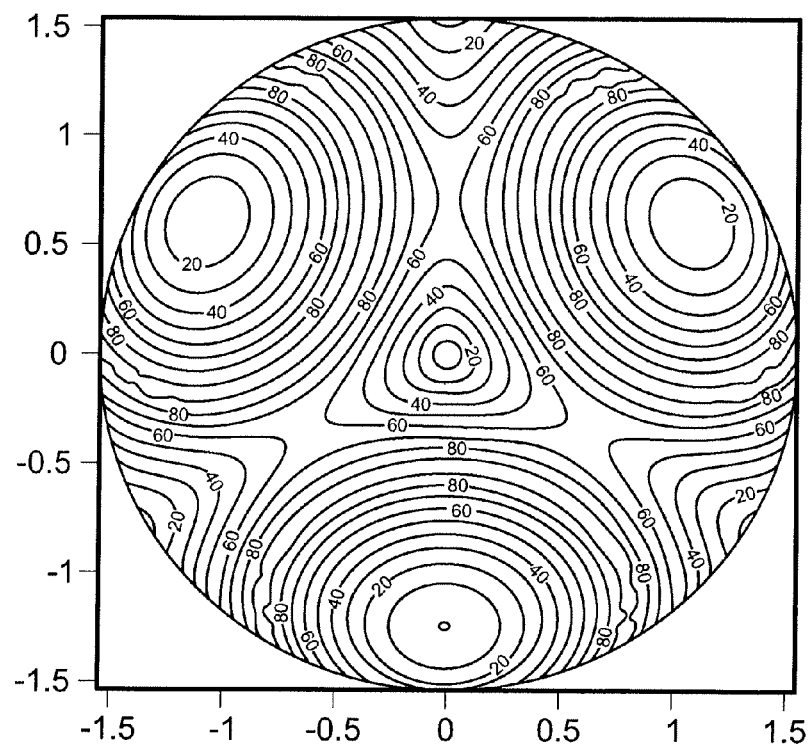
FIG. 4 shows the retardation (in nm) of a lens with [111]-orientation of conventional construction without a mutually rotated arrangement of lens elements.
Figure 5:
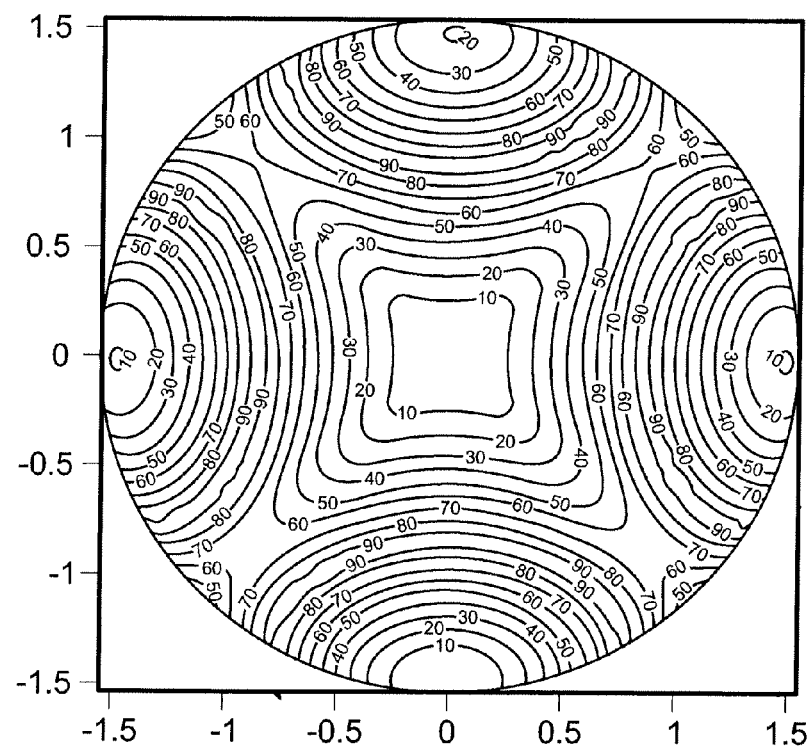
FIG. 5 shows the retardation (in nm) of a lens with [100]-orientation of conventional construction without a mutually rotated arrangement of lens elements.

As a first conclusion from comparing the results of FIGS. 4-5 against those of FIGS. 6-7, it is evident that with a lens design according to the disclosure built up of at least four lens elements that are rotated relative to each other, the residual retardation is significantly reduced in comparison to a conventional design of a lens of crystallographic [111]- or [100]-cut.

Figure 9:
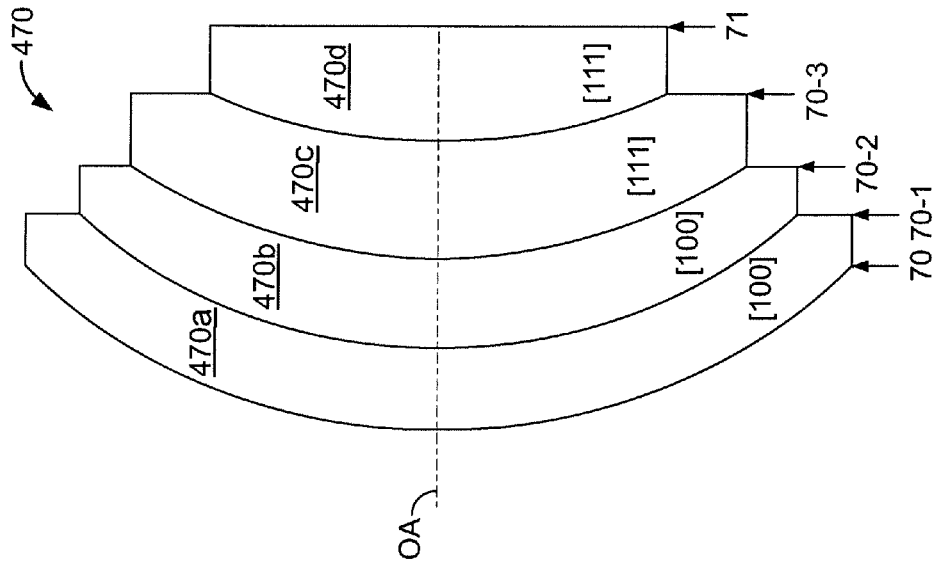
FIGS. 8, 9 each show a detailed lens section of a last lens on the image side with a non-alternating arrangement of the individual lens elements.
Figure 8:
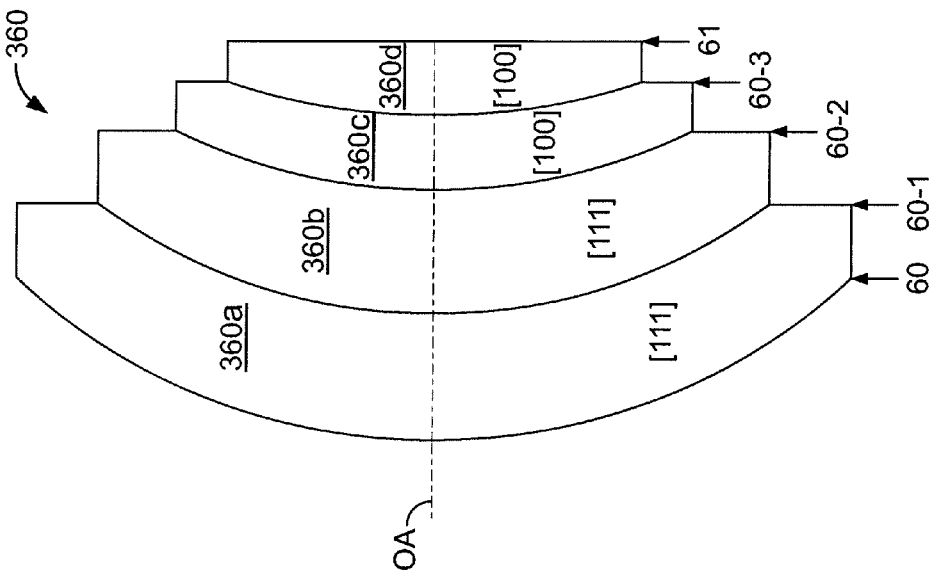

FIGS. 8 and 9 illustrate further detailed lens sections of the last-positioned lenses 360 and 470, respectively. These lenses are likewise composed of a total of four lens elements 360-360d and 470a-470d, respectively, but are arranged in a non-alternating sequence with regard to their crystallographic cut orientation. In other words, the lens elements are arranged so that they adjoin each other in pairs of the same crystallographic cut. In the lens 360 illustrated in FIG. 8, the first pair of lens elements 360a and 360b are of crystallographic [111]-cut while in the lens 470 illustrated in FIG. 9, the first pair of lens elements 470a and 470b are of crystallographic [100]-cut. The individual lens parameters of the lens elements 360a-360d and 470a-470d are listed, respectively, in Tables 5 and 6.

Figure 10A:
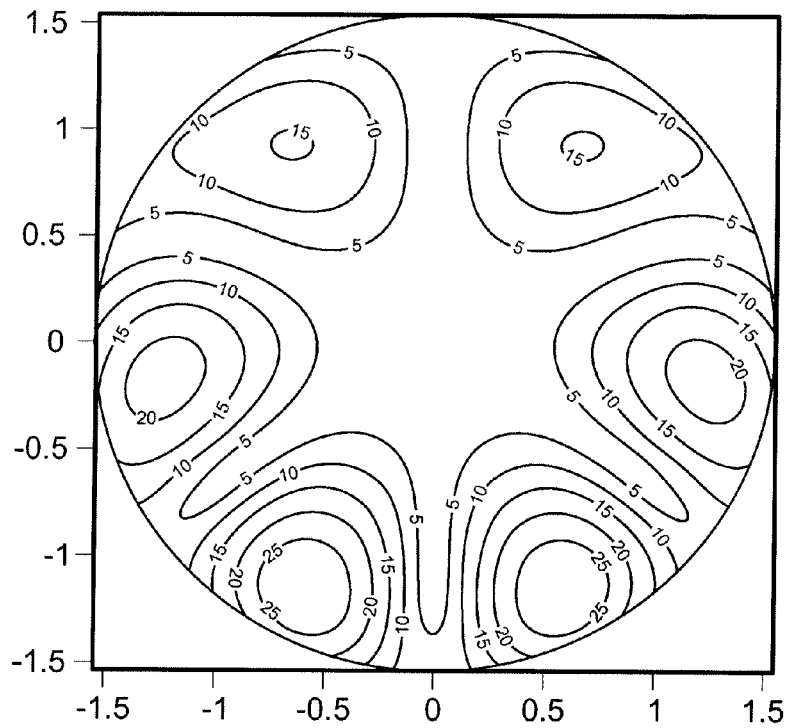
FIGS. 10a,b show the resultant retardation (in nm) if a lens of the design shown in FIG. 8 is used, for a ray bundle originating from the center of the object field (FIG. 10a) and for a ray bundle originating from the border of the object field (FIG. 10b)
Figure 10B:
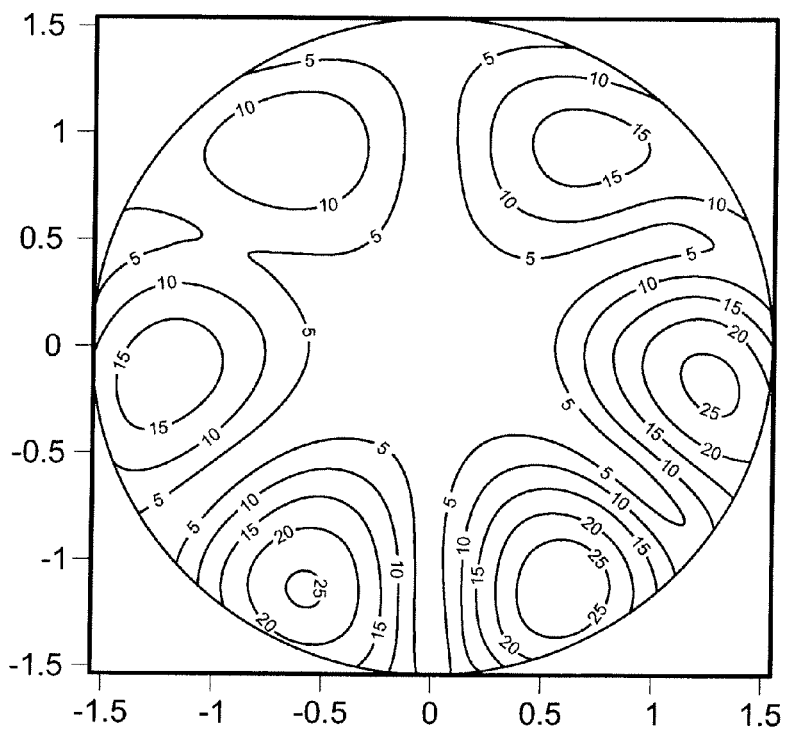
Figure 11A:
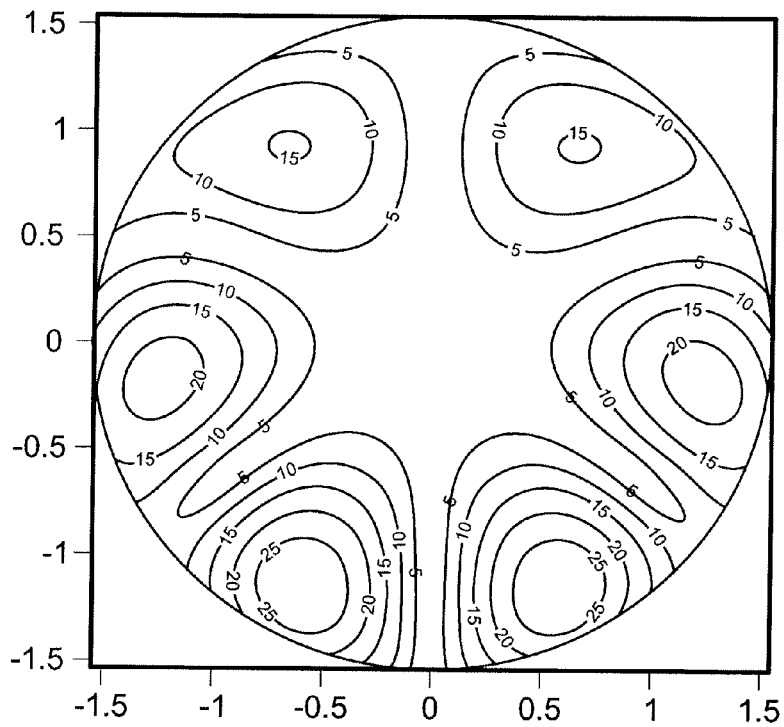
FIGS. 11a,b show the resultant retardation (in nm) if a lens of the design shown in FIG. 9 is used, for a ray bundle originating from the center of the object field (FIG. 11a) and for a ray bundle originating from the border of the object field (FIG. 11b)
Figure 11B:
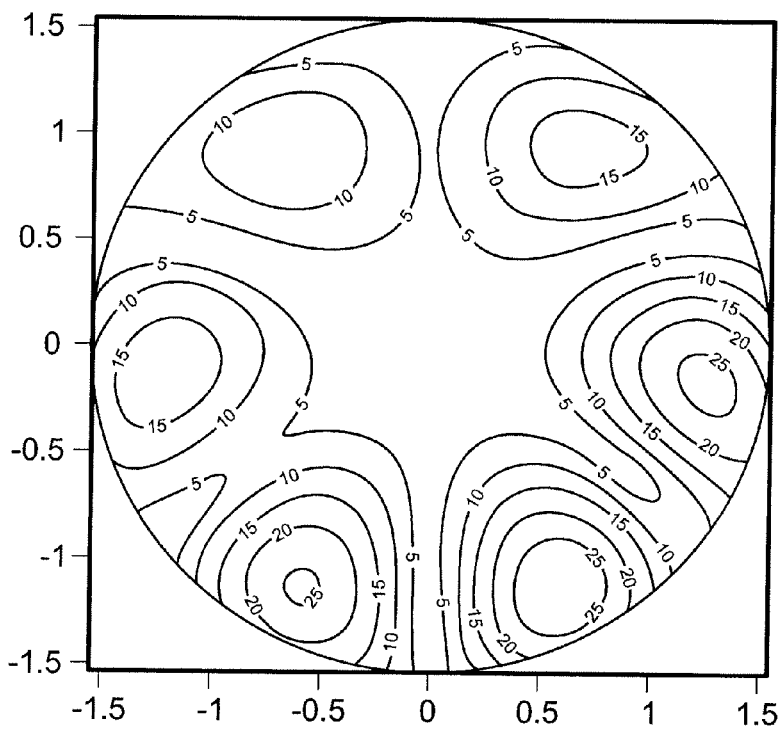

FIGS. 10a and 10b show the resultant retardation if a lens of the design shown in FIG. 8 is used, for a ray bundle originating from the center of the object field (FIG. 10a) and for a ray bundle originating from the border of the object field (FIG. 10b). FIGS. 11a and 11b show the resultant retardation if a lens of the design shown in FIG. 9 is used, for a ray bundle originating from the center of the object field (FIG. 11a) and for a ray bundle originating from the border of the object field (FIG. 11b).

From a comparison of the results of FIGS. 6, 7 against those of FIGS. 10, 11, it is evident that with a lens built up of at least four lens elements that are rotated relative to each other, the retardation values achieved with the arrangement where the lens elements alternate with regard to their crystallographic orientation (as in FIGS. 6 and 7) are smaller by a factor of about 2 compared to a non-alternating arrangement where the lens elements are set up in pairs of the same crystallographic orientation (as in FIGS. 10 and 11).

It is also possible for one or all of the lens elements of the lens which is built in accordance with the disclosure to have free crystallographic orientations as will be discussed in the following with reference to FIGS. 12 to 14.

Figure 12:
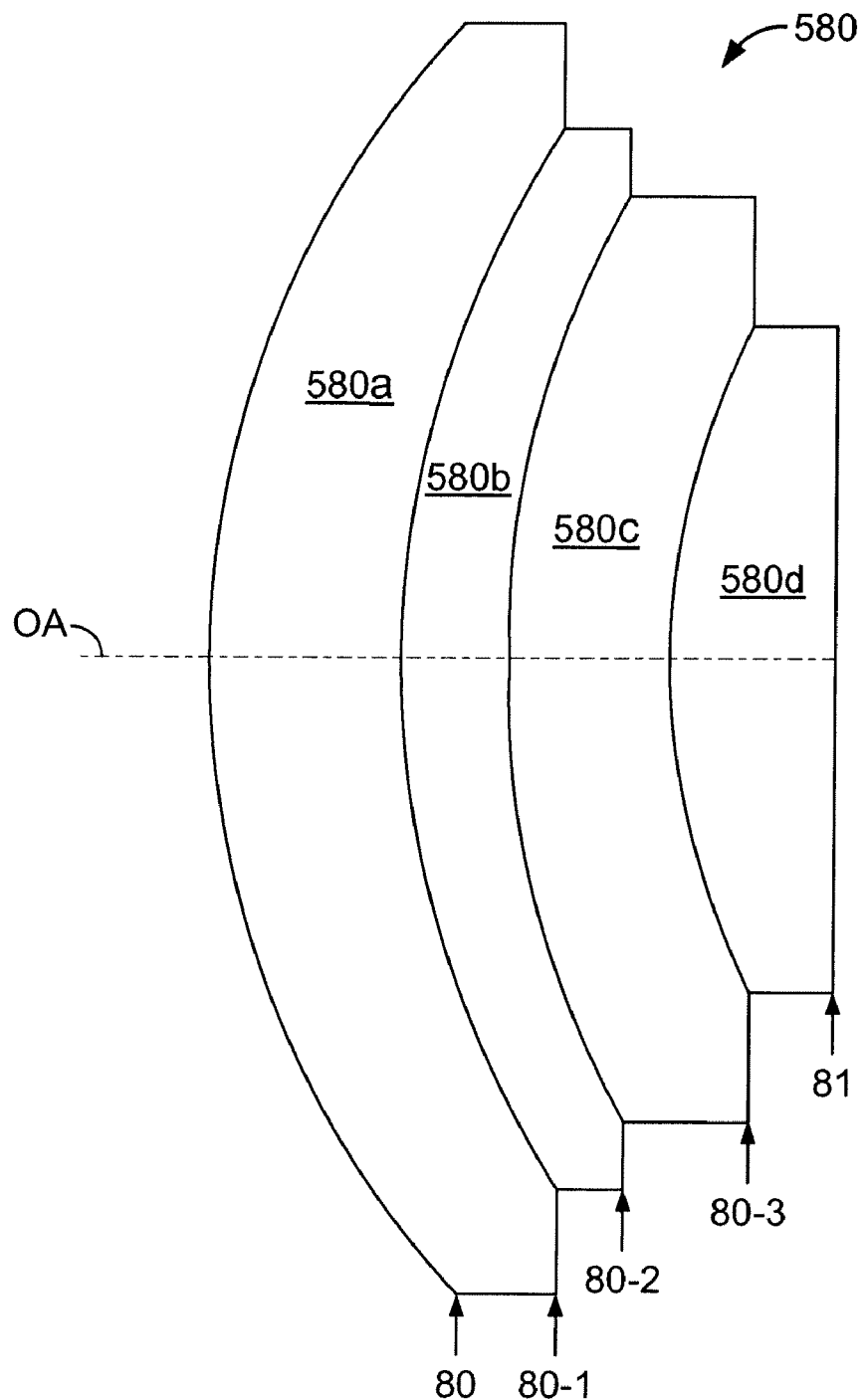
FIG. 12 shows a detailed lens section of a last lens to the image side according to an embodiment of the disclosure with free crystallographic orientations.

FIG. 12 shows a detailed lens section of a lens 580 in last position to the image side which can likewise be used in a projection objective with a configuration that is for example analogous to FIG. 1. The lens 580 is again composed of a total of four lens elements 580a, 580b, 580c and 580d, which are arranged so that they follow each other along the optical axis OA. All of the lens elements 580a to 580d are likewise made of lutetium aluminum garnet ($Lu_3Al_5O_{12}$, LuAG). The lens surfaces or the operative optical surfaces of the individual lens elements 580a to 580d in the illustrated example were again selected to be spherical for manufacturing reasons, but as an alternative they could also be aspherical in order achieve an even more far-reaching optimization of the polarization-related optical properties, i.e. a further reduction of the residual retardation. Furthermore, the lens elements 580a to 580d of the lens 580 in this embodiment again follow each other in direct contact, being for example joined to each other in an optically seamless transition achieved through the technique of wringing. Alternatively, these lens elements could also be separated by a gap, wherein the latter is filled with a liquid as has already been described above.

The individual lens parameters for the lens elements 580a-580d are listed in Table 7. Shown in column 1 are the sequential numbers for the lens element surfaces, in column 2 the respective radii (in mm) for these surfaces, in column 3 the distance (in mm)—which is called thickness—from each surface to the next-following surface, in column 4 the optically usable free half-diameter of the lens element that follows the respective surface, and in column 5 the crystallographic orientation of the lens element. Radii, thicknesses and half-diameters are again stated in millimeters. The crystallographic orientation is shown in Table 7 in terms of the three Euler angles $\phi$, $\theta$, $\psi$ which are defined as follows: A coordinate system that is at the outset identical to the reference system (x, y, z) which is fixed in space is turned into the principal axis system (x', y', z') of the crystal through the following rotations of the coordinate system: 1. rotation about the z-axis by the angle $\phi$; 2. rotation about the x-axis by the angle $\theta$; and 3. rotation about the z-axis by the angle $\psi$. A crystal with [100]-orientation can be described accordingly through the Euler angles ($\phi=0°$, $\theta=0°$, $\psi$=arbitrarily selectable, while a crystal with [111]-orientation can be described accordingly through the Euler angles $\phi=45°$, $\theta=54.736°$, $\psi$=arbitrarily selectable.

Unlike in the previously described embodiments, the optical system axis OA in the lens elements 580a-580d of the lens 580 is not pointing in the direction of one of the crystallographic orientations [100], [110] or [111] or in the direction of a principal crystallographic orientation which (due to the symmetries of cubic crystals) is equivalent to one of the crystallographic orientations [100], [110] or [111]. Although all of the lens elements 580a-580d in the embodiment of FIG. 12 deviate in their crystallographic orientation from one of the aforementioned principal crystallographic orientations (with only the lens element 580a approximating a crystallographic [111]-cut orientation), this is not meant to impose a limitation on the disclosure. Rather, the disclosure also encompasses all cases that represent variations of the concrete example of FIG. 12, meaning that for at least one of the four lens elements the optical system axis is not parallel to one of the aforementioned principal crystallographic orientations.

Figure 13A:
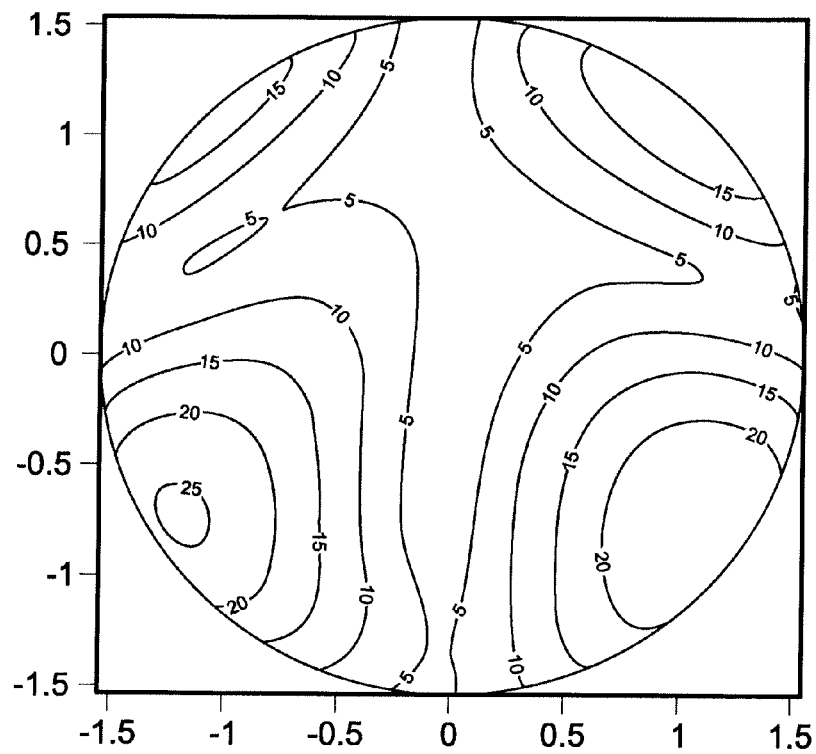
FIGS. 13a-c illustrate for the lens with free crystallographic orientations according to the disclosure as shown in FIG. 12 the resultant retardation (FIG. 13a, in nm) as well as the phase (FIG. 13b, in nm) and amplitude (FIG. 13c) of the (1,1) Jones pupil, for a ray bundle originating from the center of the object field.
Figure 13B:
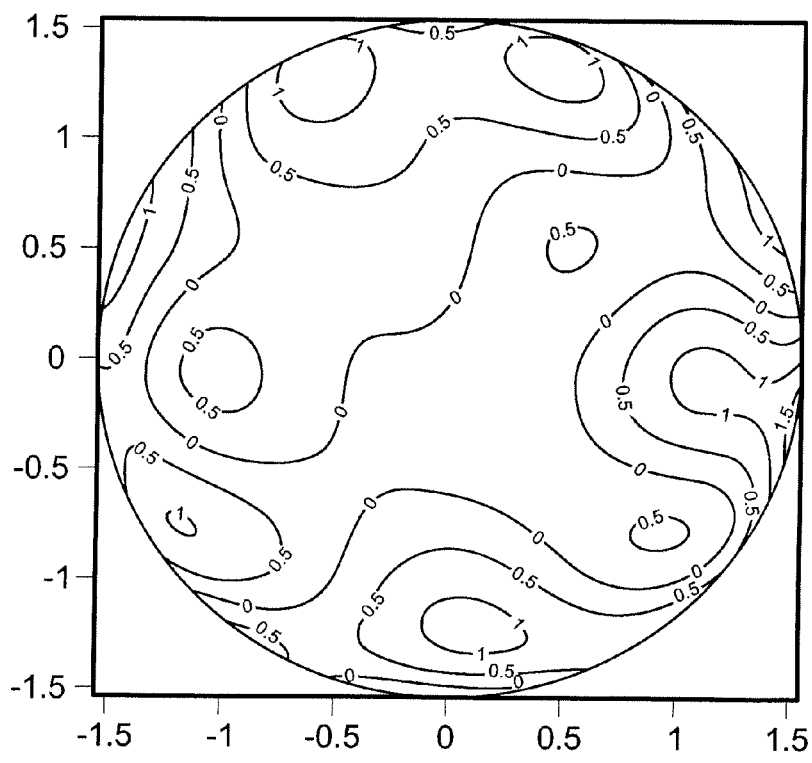
Figure 13C:
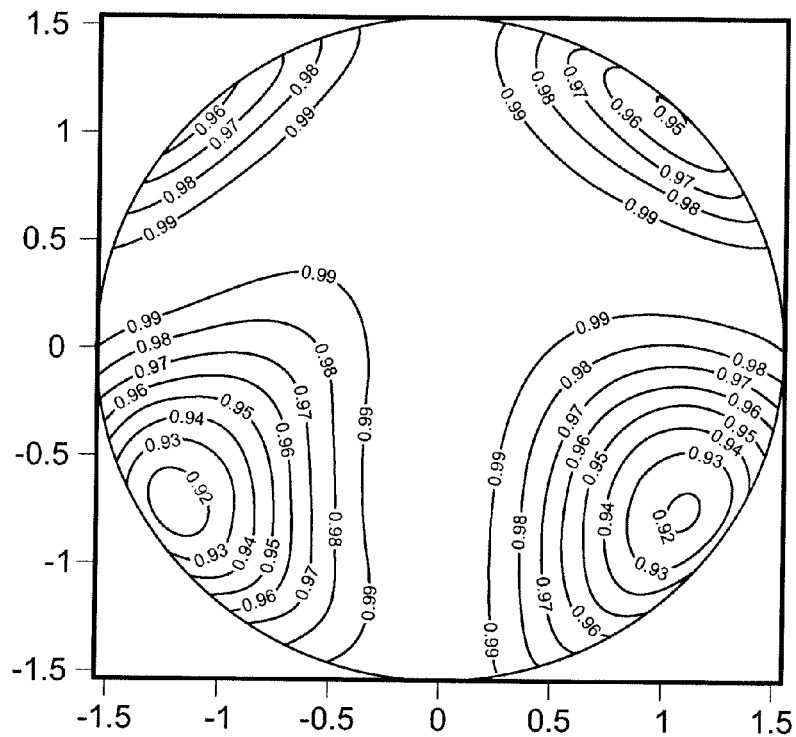
Figure 14A:
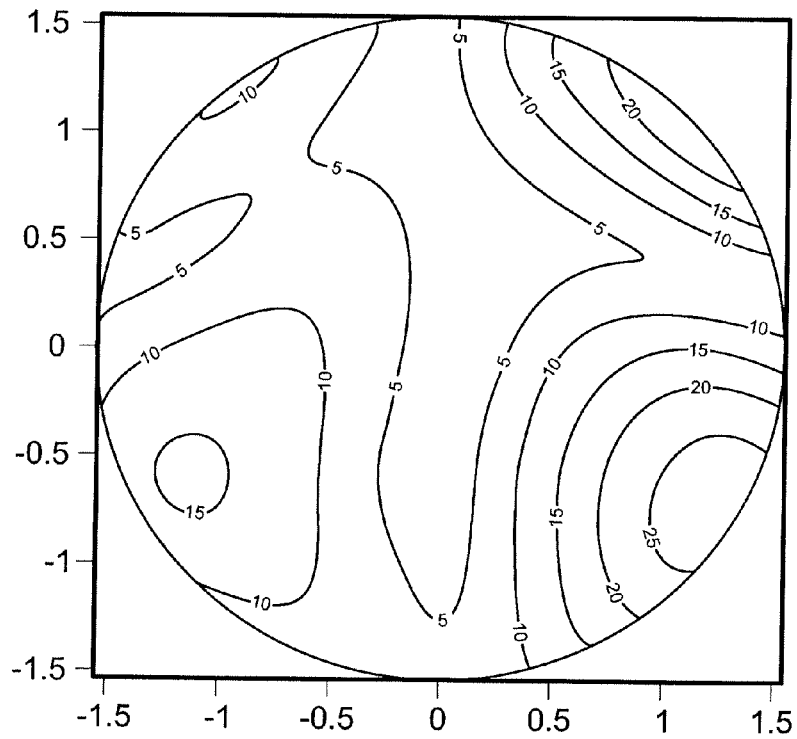
FIGS. 14a-c illustrate for the lens with free crystallographic orientations according to the disclosure as shown in FIG. 12 the resultant retardation (FIG. 14a, in nm) as well as the phase (FIG. 14b, in nm) and amplitude (FIG. 14c) of the (1,1) Jones pupil, for a ray bundle originating from the border of the object field.
Figure 14B:
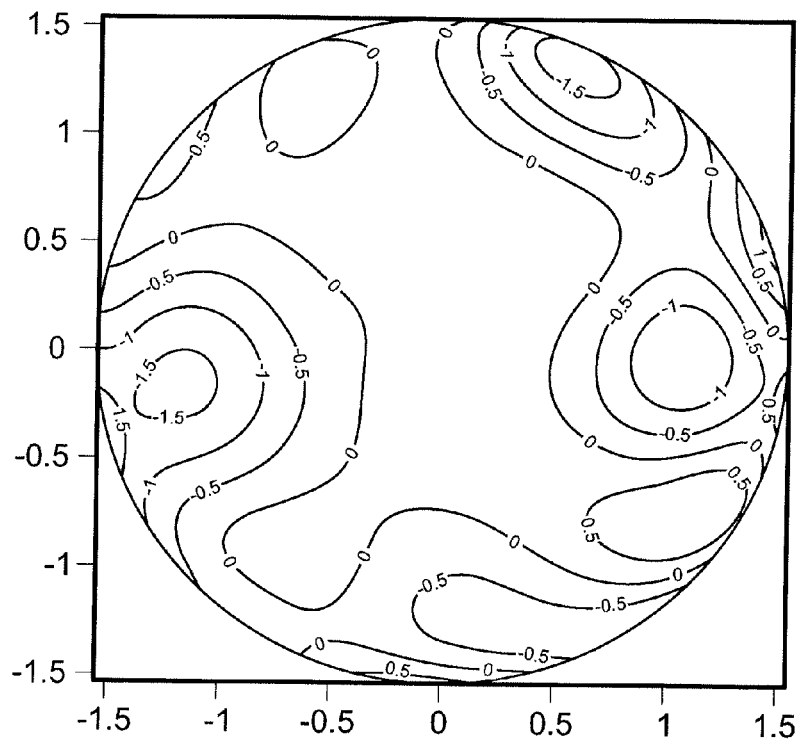
Figure 14C:
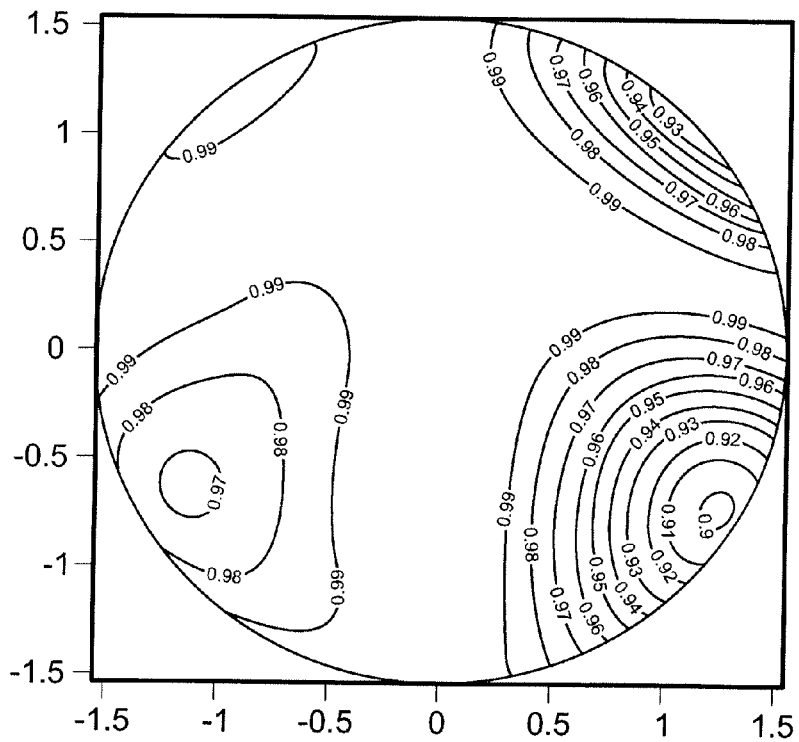

FIGS. 13a to 13c illustrate for the lens 580 with free crystallographic orientations the resultant retardation (FIG. 13a) as well as the phase (FIG. 13b) and amplitude (FIG. 13c) of the (1,1) Jones pupil for a ray bundle originating from the center of the object field. In an analogous form of representation, FIGS. 14a to 14c illustrate for the lens 580 the resultant retardation (FIG. 14a) as well as the phase (FIG. 14b) and amplitude (FIG. 14c) of the (1,1) Jones pupil for a ray bundle originating from the border of the object field. As is evident from FIGS. 13b and 14b, the phase in this embodiment is reduced to very small values within a range of at most 1.5 nm. While the amplitude in the quadrants (in the 45° locations) reaches values up to about 0.9, this is only of minor consequence in imaging processes where primarily the areas of the x- and y-axis in the pupil are being used.

Figure 15:
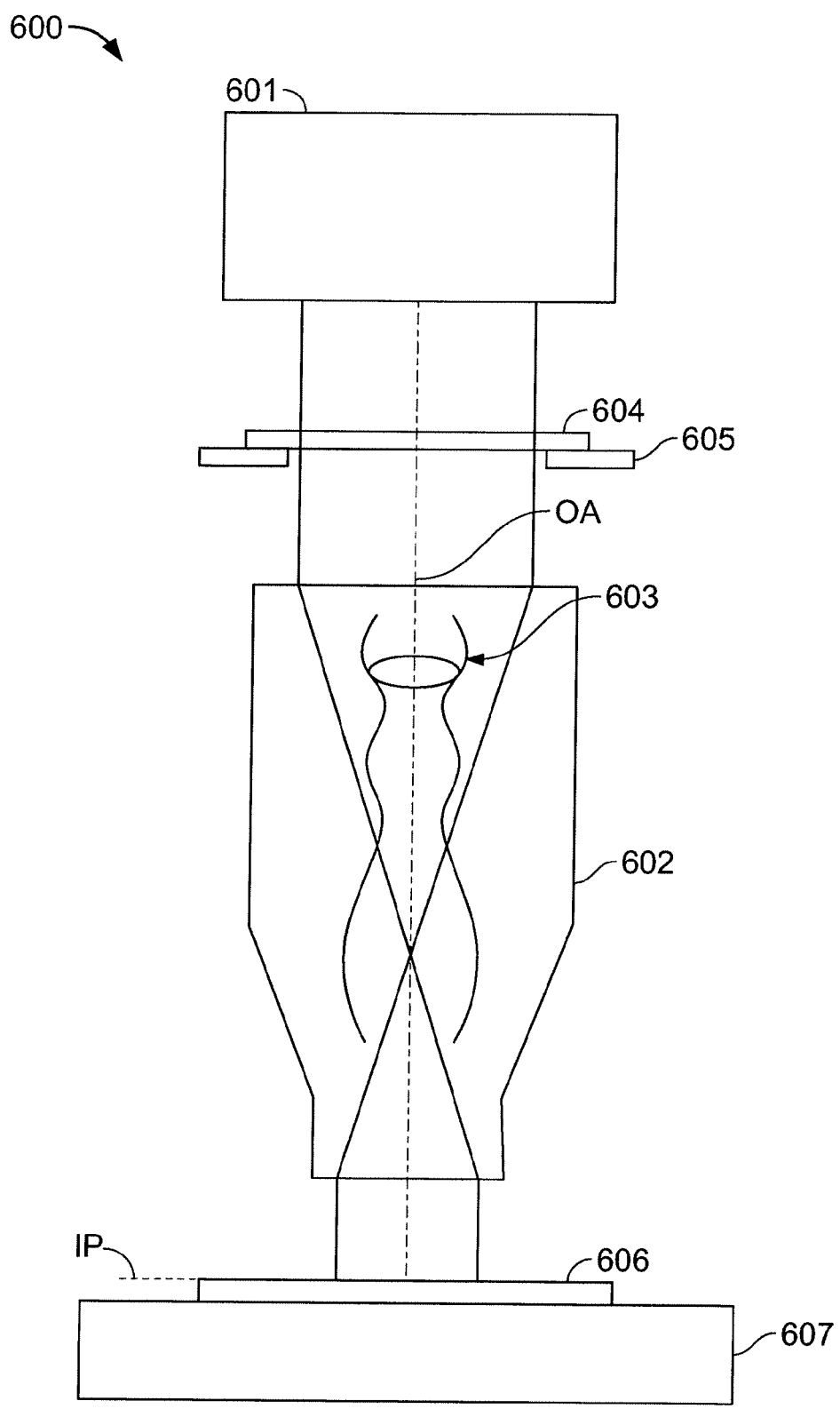
FIG. 15 schematically illustrates the overall design concept of a microlithographic projection exposure apparatus.

A projection exposure apparatus 600 according to FIG. 15 includes an illumination device 601 and a projection objective 602. The projection objective 602 encompasses a lens arrangement 603 which is only schematically outlined and through which an optical axis OA is defined. Arranged between the illumination device 601 and the projection objective 602 is a mask 604 which is held in the light path via a mask holder 605. The mask 604 carries a structure in the micrometer- to nanometer range, an image of which is projected via the projection objective 602 into an image plane IP, for example reduced by a factor or 4 or 5. A light-sensitive substrate 606, specifically a wafer, which is positioned by a substrate holder 607 is held in place in the image plane IP.

Other embodiments are in the claims.

TABLE 1

(Design Data for FIG. 1):
(NA = 1.55; wavelength 193 nm)

| Surface | Radius | Thickness | Material | Refr. Index | Half-diameter |
|---|---|---|---|---|---|
| 0 | 0.000000 | 52.291526 | | | 62.5 |
| 1 | 185.414915 | 36.606310 | SILUV | 1.560364 | 93.9 |
| 2 | −2368.330782 | 103.305956 | | | 94.5 |
| 3 | 1135.440971 | 81.730311 | SILUV | 1.560364 | 101.4 |
| 4 | −836.574481 | 7.626264 | | | 101.9 |
| 5 | 642.761068 | 10.166290 | SILUV | 1.560364 | 94.3 |
| 6 | −28777.509893 | 17.021812 | | | 92.4 |
| 7 | 374.784051 | 23.493394 | SILUV | 1.560364 | 88.9 |
| 8 | −739.574652 | 12.599110 | | | 86.7 |
| 9 | 0.000000 | 0.000000 | SILUV | 1.560364 | 82.0 |
| 10 | 0.000000 | 35.701682 | | | 82.0 |
| 11 | −287.062457 | 8.020868 | SILUV | 1.560364 | 87.6 |
| 12 | −260.605102 | 8.348886 | | | 89.8 |
| 13 | 356.037256 | 34.761348 | SILUV | 1.560364 | 102.3 |
| 14 | −1139.573155 | 45.988038 | | | 103.0 |
| 15 | −297.853763 | 10.898517 | SILUV | 1.560364 | 100.8 |
| 16 | −286.492576 | 442.012212 | | | 102.4 |
| 17 | −186.492728 | −232.661918 | REFL | | 162.7 |
| 18 | 213.357562 | 272.661219 | REFL | | 150.8 |
| 19 | 186.190755 | 63.407664 | SILUV | 1.560364 | 143.4 |
| 20 | 559.595962 | 102.212676 | | | 138.9 |
| 21 | 336.987586 | 10.146122 | SILUV | 1.560364 | 98.0 |
| 22 | 98.067417 | 59.917522 | | | 83.0 |
| 23 | 2014.227818 | 10.231531 | SILUV | 1.560364 | 83.9 |
| 24 | 209.706892 | 5.218396 | | | 88.7 |
| 25 | 187.199398 | 16.497859 | SILUV | 1.560364 | 90.5 |
| 26 | 563.378273 | 25.195888 | | | 92.4 |
| 27 | −358.535155 | 9.999385 | SILUV | 1.560364 | 95.4 |
| 28 | −369.270277 | 4.329131 | | | 104.5 |
| 29 | 6342.575536 | 49.942200 | SILUV | 1.560364 | 124.0 |
| 30 | −323.631832 | 0.997442 | | | 127.3 |
| 31 | −503.301175 | 35.880564 | SILUV | 1.560364 | 129.5 |
| 32 | −236.865310 | 0.997844 | | | 132.5 |
| 33 | −1601.468501 | 29.219759 | SILUV | 1.560364 | 133.0 |
| 34 | −298.758201 | 1.000000 | | | 134.0 |
| 35 | 808.661277 | 24.892404 | SILUV | 1.560364 | 130.1 |
| 36 | −2015.744411 | 1.000000 | | | 128.8 |
| 37 | 232.975060 | 41.179286 | SILUV | 1.560364 | 120.7 |
| 38 | 2382.195206 | 1.000000 | | | 116.6 |
| 39 | 192.288001 | 45.336304 | SILUV | 1.560364 | 110.2 |
| 40 | −1085.511304 | 1.000000 | | | 107.6 |
| 41 | 139.778134 | 25.996093 | SILUV | 1.560364 | 84.0 |
| 42 | 482.429105 | 1.000000 | | | 78.8 |
| 43 | 83.925256 | 60.000000 | LUAG | 2.143500 | 60.2 |
| 44 | 0.000000 | 3.100000 | HI INDEX | 1.650000 | 24.1 |
| 45 | 0.000000 | 0.000000 | | | 15.6 |

TABLE 2

(Aspherical Constants for FIG. 1):

| Surface | 1 | 4 | 6 | 8 | 12 | 14 |
|---|---|---|---|---|---|---|
| K | 0 | 0 | 0 | 0 | 0 | 0 |
| C1 | −6.447148E−08 | −1.825065E−07 | 7.288539E−08 | 1.468587E−07 | −8.341858E−09 | −5.818454E−08 |
| C2 | 3.904192E−12 | 1.875167E−12 | 4.464300E−12 | −6.136079E−12 | 3.035481E−12 | −2.919573E−13 |
| C3 | −1.742805E−16 | 9.471479E−16 | −3.280221E−16 | −6.664138E−16 | 1.950958E−16 | −3.209102E−17 |
| C4 | −2.099949E−21 | −3.417617E−20 | −1.914887E−20 | −1.246213E−20 | 6.966650E−21 | 3.126755E−22 |
| C5 | 1.526611E−24 | −3.618274E−24 | 5.811541E−24 | 4.088277E−24 | 1.855444E−24 | 3.818902E−25 |
| C6 | −1.341115E−28 | 3.456865E−28 | −6.504073E−28 | 7.614765E−29 | −1.407831E−28 | −8.486242E−30 |
| C7 | 3.864081E−33 | −8.427102E−33 | 3.066152E−32 | −1.622968E−32 | −3.044932E−33 | −2.419178E−34 |

| Surface | 15 | 17 | 18 | 20 | 21 | 23 |
|---|---|---|---|---|---|---|
| K | 0 | −1.9096 | −0.5377 | 0 | 0 | 0 |
| C1 | −3.254341E−08 | −2.658999E−08 | −1.536262E−10 | −8.785831E−09 | 6.965245E−08 | −9.869141E−08 |
| C2 | 3.968952E−13 | 1.561056E−13 | −2.682680E−15 | 5.646919E−13 | −2.619816E−13 | 3.468310E−12 |
| C3 | −2.807842E−17 | −4.132973E−18 | −3.645198E−20 | −6.454482E−18 | 9.867326E−18 | −1.114544E−15 |
| C4 | 4.190647E−21 | 5.067872E−23 | 1.499409E−24 | −2.410154E−22 | −6.513277E−21 | 1.484338E−19 |

TABLE 2-continued (Aspherical Constants for FIG. 1):

| | | | | | | |
|---|---|---|---|---|---|---|
| C5 | −3.741144E−25 | −9.622504E−28 | 1.222432E−28 | 1.104073E−26 | 1.222326E−25 | −2.541221E−23 |
| C6 | 3.532694E−29 | 1.189984E−32 | −6.277586E−33 | −2.437139E−31 | −7.772178E−30 | 2.753259E−27 |
| C7 | −1.204525E−33 | −1.166383E−37 | 1.594458E−37 | 2.163229E−36 | −1.760691E−33 | −1.058751E−31 |

| Surface | 25 | 28 | 29 | 31 | 33 |
|---|---|---|---|---|---|
| K | 0 | 0 | 0 | 0 | 0 |
| C1 | −3.835477E−08 | 1.214957E−07 | 5.348537E−08 | 3.570488E−09 | −1.108288E−08 |
| C2 | −7.670508E−12 | 1.647962E−12 | 2.629539E−12 | −2.899790E−13 | −5.556755E−13 |
| C3 | 7.876676E−16 | −5.350727E−16 | −5.067530E−16 | 1.081327E−16 | −3.884368E−18 |
| C4 | −1.643323E−19 | 3.115581E−20 | 4.241183E−20 | −1.172829E−20 | 1.842426E−21 |
| C5 | 1.862076E−23 | −6.028858E−24 | −2.286931E−24 | 2.404194E−25 | 3.001406E−27 |
| C6 | −1.538795E−27 | 5.836667E−28 | 6.869266E−29 | 1.461820E−29 | −7.804121E−30 |
| C7 | 6.396967E−32 | −1.784413E−32 | −8.391190E−34 | −5.103661E−34 | 2.042295E−34 |

| Surface | 36 | 38 | 40 | 42 |
|---|---|---|---|---|
| K | 0 | 0 | 0 | 0 |
| C1 | 1.098120E−08 | 3.498535E−09 | 4.009017E−08 | 6.190270E−09 |
| C2 | −8.319264E−13 | 1.277784E−12 | −5.714125E−12 | 1.866031E−11 |
| C3 | 3.311901E−17 | −7.357487E−17 | 6.202718E−16 | −3.186549E−15 |
| C4 | 7.733186E−23 | 1.115535E−21 | −5.344939E−20 | 5.219881E−19 |
| C5 | −1.051458E−26 | 2.894369E−25 | 3.354852E−24 | −6.008898E−23 |
| C6 | −4.556477E−30 | −1.579978E−29 | −1.359158E−28 | 4.502251E−27 |
| C7 | 1.779547E−34 | 3.499951E−34 | 2.690400E−33 | −1.632255E−31 |

TABLE 3

(Design Data for FIG. 2)

| Surface | Radius | Thickness | Half-diameter | Orientation |
|---|---|---|---|---|
| 43 | 83.925256 | 18.811177 | 59.352000 | [111], 0° |
| 43-1 | 71.231464 | 12.333822 | 47.005000 | [100], 0° |
| 43-2 | 67.178888 | 17.981551 | 39.406000 | [111], 60° |
| 43-3 | 112.134029 | 10.873450 | 29.975000 | [100], 45° |

TABLE 4

(Design Data for FIG. 3)

| Surface | Radius | Thickness | Half-diameter | Orientation |
|---|---|---|---|---|
| 55 | 83.925256 | 12.607042 | 59.352000 | [100], 0° |
| 55-1 | 77.135134 | 17.932508 | 51.420000 | [111], 0° |
| 55-2 | 69.245362 | 12.671515 | 40.045000 | [100], 45° |
| 55-3 | 83.666266 | 16.788934 | 33.150000 | [111], 60° |

TABLE 5

(Design Data for FIG. 8)

| Surface | Radius | Thickness | Half-diameter | Orientation |
|---|---|---|---|---|
| 60 | 83.925256 | 19.035457 | 59.352000 | [111], 0° |
| 60-1 | 76.747847 | 18.570918 | 47.807000 | [111], 60° |
| 60-2 | 79.720372 | 11.251608 | 36.706000 | [100], 0° |
| 60-3 | 89.328649 | 11.142019 | 29.359000 | [100], 45° |

TABLE 6

(Design Data for FIG. 9)

| Surface | Radius | Thickness | Half-diameter | Orientation |
|---|---|---|---|---|
| 70 | 83.925256 | 12.393240 | 59.352000 | [100], 0° |
| 70-1 | 76.816691 | 13.261777 | 51.476000 | [100], 45° |

TABLE 6-continued (Design Data for FIG. 9)

| Surface | Radius | Thickness | Half-diameter | Orientation |
|---|---|---|---|---|
| 70-2 | 77.973028 | 17.501591 | 44.111000 | [111], 0° |
| 70-3 | 82.294822 | 16.843390 | 33.101000 | [111], 60° |

TABLE 7

(Design Data for FIG. 12)

| Surface | Radius | Thickness | Half-diameter | Euler-Angles $\phi$, $\theta$, $\psi$ |
|---|---|---|---|---|
| 80 | 83.925255 | 18.511684 | 59.352 | 45.00°, 54.74°, 0° |
| 80-1 | 88.452895 | 10.271444 | 49.77 | 68.67°, −1.62°, −64.28° |
| 80-2 | 88.273071 | 15.476090 | 43.292 | 43.54°, 55.62°, 61.84° |
| 80-3 | 67.128546 | 15.740778 | 31.226 | 31.43°, 4.97°, 14.66° |

What is claimed is:

1. A projection objective with an optical axis, the projection objective configured to project an image of a mask which can be positioned in an object plane onto a light-sensitive coating which can be positioned in an image plane, the projection objective comprising:
   at least one lens which has at least one curved lens surface and includes at least four lens elements comprising intrinsically birefringent material which are arranged so that they contact each other in a mutually adjacent relationship along the optical axis of the projection objective;
   wherein:
   the at least four lens elements comprise two pairs of lens elements,
   the lens elements in the one pair of lens elements have a crystallographic [111]-cut and are arranged relative to each other with a rotary offset about the optical axis of the projection objective, the lens elements in the other pair of lens elements have a crystallographic [100]-cut and are arranged relative to each other with a rotary offset about the optical axis of the projection objective, three of the four lens elements have a convex surface which is faced towards a concave surface of an adjacent one of the lens elements, all successive lens elements of the lens elements are separated from each other by a curved boundary, each of the curved boundaries is rotational symmetric relative to the optical axis of the projection objective, and the projection objective is a microlithographic projection exposure apparatus projection objective.

2. The projection objective to claim 1, wherein the four lens elements follow each other in alternating sequence relative to their respective crystallographic cuts.

3. The projection objective according to claim 1, wherein at least two surfaces are faced towards each other and belonging to adjacent ones of the lens elements have radii of curvature such that the difference of the absolute values of these radii of curvature is less than 10% of the larger one of the radii of curvature.

4. The projection objective according to claim 1, wherein at least two surfaces are faced towards each other and belonging to adjacent ones of the lens elements have radii of curvature of the same absolute value.

5. The projection objective according to claim 1, wherein at least two surfaces are faced towards each other and belonging to adjacent ones of the lens elements have, at each point of one of the surfaces, a distance in the normal direction to the surface being less than 2 millimeters (mm).

6. The projection objective according to claim 1, wherein all of the lens elements are arranged with rotational symmetry relative to the optical axis of the projection objective.

7. The projection objective according to claim 1, wherein at least one of the lens elements has at least one spherical lens surface.

8. The projection objective according to claim 1, wherein each of the lens elements has at least one spherical lens surface.

9. The projection objective according to claim 1, wherein at least one of the lens elements has at least one aspherical lens surface.

10. The projection objective according to claim 1, wherein at least two of the lens elements are joined together in an optically seamless manner.

11. The projection objective according to claim 1, wherein all of the lens elements are joined together in an optically seamless manner.

12. The projection objective according to claim 1, wherein at least two of the lens elements are separated from each other by a gap.

13. The projection objective according to claim 12, wherein the gap is filled with a liquid.

14. The projection objective according to claim 13, wherein the liquid has a refractive index which differs by no more than 30% from the refractive indices of the materials of the adjoining lens elements.

15. The projection objective according to claim 1, wherein the lens has a convex-curved lens surface facing towards the side of the object plane.

16. The projection objective according to claim 1, wherein the lens is a planar-convex lens.

17. The projection objective according to claim 1, wherein the lens is in last position to the side of the image plane of the projection objective.

18. The projection objective according to claim 1, wherein the lens elements are made of a material selected from the group containing gamets, in particular lutetium aluminum garnet ($Lu_3Al_5O_{12}$) and yttrium aluminum garnet ($Y_3Al_5O_{12}$), lithium barium fluoride ($LiBaF_3$), and spinel, in particular magnesium spinel ($MgAl_2O_4$).

19. A microlithographic projection exposure apparatus with an illumination device and a projection objective, wherein the projection objective is configured in accordance with claim 1.

20. A method, comprising:
providing a substrate which is at least partially covered with a coating of a light-sensitive material;
providing a mask comprising structures from which an image is to be formed;
providing a projection exposure apparatus in accordance with claim 19; and
projecting at least a part of the mask onto an area of the coating using the projection exposure apparatus to provide a microstructured component.

* * * * *

UNITED STATES PATENT AND TRADEMARK OFFICE
CERTIFICATE OF CORRECTION

PATENT NO. : 7,679,831 B2
APPLICATION NO. : 11/838995
DATED : March 16, 2010
INVENTOR(S) : Daniel Kraehmer It is certified that error appears in the above-identified patent and that said Letters Patent is hereby corrected as shown below:

Column 1, Line 9, delete "119(e)(1)" insert -- 119 (e) (1) --.

Column 1, Line 51, delete "mutu-ally" insert -- mutually --.

Column 3, Line 52, delete "crystal-lographic" insert -- crystallographic --.

Column 3, Line 55, delete "pro-jection" insert -- projection --.

Column 4, Line 9, delete "(Lu3A15O12)" insert -- $(Lu_3Al_5O_{12})$ --.

Column 4, Line 23, delete "(Lu3A15O12)" insert -- $(Lu_3Al_5O_{12})$ --.

Column 4, Line 30, delete "(Lu3A15O12)" insert -- $(Lu_3Al_5O_{12})$ --.

Column 4, Line 34, delete "(LiBaF3)" insert -- $(LiBaF_3)$ --.

Column 4, Line 40, delete "(Lu3A15O12)" insert -- $(Lu_3Al_5O_{12})$ --.

Column 4, Line 42, delete "crys-tallographic" insert -- crystallographic --.

Column 4, Line 45, delete "rela-tive" insert -- relative --.

Column 4, Line 50, delete "microlitho-graphic" insert -- microlithographic --.

Column 4, Line 52, delete "(Lu3A15O12)" insert -- $(Lu_3Al_5O_{12})$ --.

Column 4, Line 62, delete "crystal-lographic" insert -- crystallographic --.

Column 4, Line 63, delete "re-spective" insert -- respective --.

Column 4, Line 66, delete "pro-jection" insert -- projection --.

Signed and Sealed this

First Day of June, 2010

David J. Kappos
*Director of the United States Patent and Trademark Office*

Column 7, Line 27, delete "HIINDEX" insert -- HI INDEX --.

Column 14, Line 64, Claim 1, after "in" delete "the".

Column 16, Line 26, Claim 18, delete "gamets," and insert -- garnets, --.